(12) United States Patent
Araishi

(10) Patent No.: US 11,895,277 B2
(45) Date of Patent: Feb. 6, 2024

(54) OPENING/CLOSING COVER ATTACHMENT STRUCTURE WHICH COUPLES OPENING/CLOSING COVER TO COVER ATTACHING BODY IN A TURNABLE MANNER

(71) Applicant: KYOCERA Document Solutions Inc., Osaka (JP)

(72) Inventor: Kuniaki Araishi, Osaka (JP)

(73) Assignee: KYOCERA Document Solutions Inc., Osaka (JP)

( * ) Notice: Subject to any disclaimer, the term of this patent is extended or adjusted under 35 U.S.C. 154(b) by 432 days.

(21) Appl. No.: 17/186,595

(22) Filed: Feb. 26, 2021

(65) Prior Publication Data

US 2021/0274054 A1   Sep. 2, 2021

(30) Foreign Application Priority Data

Feb. 28, 2020   (JP) ................................ 2020-032602

(51) Int. Cl.
| H04N 1/00 | (2006.01) |
| H05K 5/02 | (2006.01) |
| H05K 5/03 | (2006.01) |

(52) U.S. Cl.
CPC ....... H04N 1/00546 (2013.01); H05K 5/0226 (2013.01); H05K 5/03 (2013.01)

(58) Field of Classification Search
CPC ..... H05K 5/03; H05K 5/0226; H04N 1/00546
See application file for complete search history.

(56) References Cited

U.S. PATENT DOCUMENTS

| 5,659,928 | A | * | 8/1997 | Komaki | ................ | E05D 7/1016 |
| | | | | | | 16/338 |
| 5,675,934 | A | * | 10/1997 | Park | ...................... | F25D 23/028 |
| | | | | | | 16/DIG. 23 |
| 5,996,132 | A | * | 12/1999 | Sorimachi | ............... | A47K 13/12 |
| | | | | | | 16/306 |
| 6,421,842 | B1 | * | 7/2002 | Fujita | ...................... | A47K 13/12 |
| | | | | | | 4/234 |
| 7,147,218 | B2 | * | 12/2006 | Izumi | ................. | G03G 15/6529 |
| | | | | | | 271/145 |
| 7,495,158 | B2 | * | 2/2009 | Nagatsuma | ............... | G10C 3/02 |
| | | | | | | 84/423 R |

(Continued)

FOREIGN PATENT DOCUMENTS

JP   2009-258325 A   11/2009

*Primary Examiner* — Rockshana D Chowdhury
*Assistant Examiner* — Douglas R Burtner
(74) *Attorney, Agent, or Firm* — Studebaker & Brackett PC

(57) ABSTRACT

An opening/closing cover attachment structure couples an edge of an opening/closing cover to a cover attaching body in a turnable manner. The opening/closing cover attachment structure includes a first hinge, a second hinge and a holding part. The first hinge and the second hinge are disposed on the edge of the opening/closing cover via an interval. The holding part is disposed outside between the first hinge and the second hinge, and capable of holding the opening/closing cover in a closing state and releasing the holding. Hinge axes of the first hinge and the second hinge are sifted each other in a front-and-rear direction of the opening/closing cover, such that it becomes possible to reduce a level difference between contact end portions of the opening/closing cover in the closing state and the cover attaching body.

7 Claims, 24 Drawing Sheets

(56) References Cited

U.S. PATENT DOCUMENTS

| | | | | |
|---|---|---|---|---|
| 7,778,572 B2* | 8/2010 | Iijima | ................ | G03G 21/1628 347/108 |
| 7,908,715 B2* | 3/2011 | Ogatsu | ................ | H04M 1/0216 24/3.1 |
| 9,020,368 B2* | 4/2015 | Uohashi | ................ | H01H 13/02 399/9 |
| 9,037,036 B2* | 5/2015 | Yamashita | ......... | G03G 21/1633 399/110 |
| 9,229,420 B2* | 1/2016 | Akiyama | ................ | E05D 3/12 |
| 9,565,931 B2* | 2/2017 | Shiohara | ................ | E06B 5/00 |
| 10,498,115 B2* | 12/2019 | Paul | ................ | A01G 25/165 |
| 10,520,877 B2* | 12/2019 | Kawaguchi | ........ | G03G 21/1633 |
| 10,648,211 B2* | 5/2020 | Gorenbacher | ........ | E05D 7/0407 |
| 10,781,621 B2* | 9/2020 | Kondo | ................ | E05D 11/1064 |
| 10,788,785 B2* | 9/2020 | Kondo | ................ | G03G 15/60 |
| 10,821,626 B2* | 11/2020 | Shimizu | ................ | B27F 7/38 |
| 2003/0161113 A1* | 8/2003 | Wrycraft | ............. | H05K 5/0226 361/724 |
| 2007/0138193 A1* | 6/2007 | Aono | ................ | B41J 29/02 220/810 |
| 2009/0134755 A1* | 5/2009 | Lakoduk | ................ | H02B 1/46 29/428 |
| 2013/0283567 A1* | 10/2013 | Yamaguchi | ............... | E05D 3/02 16/260 |
| 2014/0375196 A1* | 12/2014 | Nguyen | ................ | H05K 5/03 29/592 |
| 2015/0027774 A1* | 1/2015 | Kang | ................ | H05K 5/0004 174/535 |
| 2016/0286672 A1* | 9/2016 | Wolf | ................ | H05K 7/1462 |
| 2017/0048999 A1* | 2/2017 | Abee | ................ | H02B 1/28 |
| 2017/0064849 A1* | 3/2017 | Kitaoka | ................ | G06K 13/08 |
| 2018/0048132 A1* | 2/2018 | Dinh | ................ | H02G 3/081 |
| 2021/0274054 A1* | 9/2021 | Araishi | ................ | H05K 5/03 |
| 2023/0109427 A1* | 4/2023 | Tsorng | ............... | H05K 7/20727 361/679.02 |
| 2023/0276590 A1* | 8/2023 | Yamamoto | ........... | H05K 5/0226 361/679.01 |

\* cited by examiner

OPENING/CLOSING COVER ATTACHMENT STRUCTURE WHICH COUPLES OPENING/CLOSING COVER TO COVER ATTACHING BODY IN A TURNABLE MANNER

INCORPORATION BY REFERENCE

This application is based on and claims the benefit of priority from Japanese patent application No. 2020-032602 filed on Feb. 28, 2020, which is incorporated by reference in its entirety.

BACKGROUND

The present disclosure relates to a cover attachment structure.

An opening/closing cover is coupled to a frame of an apparatus main body (a cover attaching body) of an image forming apparatus in a turnable manner around a hinge axis with a pair of upper and lower hinges at its one side edge. Additionally, a holding part capable of holding the opening/closing cover in a closing state and releasing the holding is disposed on a lateral side of between the upper and lower hinges. The holding part has a magnet and a magnet attachment part which are distributed to the opening/closing cover and the apparatus main body, for example.

In the cover attachment structure of this type, the upper hinge and the lower hinge may be attached to separate members provided to the frame. Then, the cover attachment may have a configuration such that a hinge axis of the upper hinge is shifted to a hinge axis of the lower hinge in a front-and-back direction of the opening/closing cover. Alternatively, even if the upper hinge and the lower hinge are attached to a single member of the frame, it is difficult to align the hinge axis of the upper hinge with the hinge axis of the lower hinge. As a result, between a contact end portion of the opening/closing cover and a contact end portion of the cover attaching body, a level difference or a gap is formed. This causes a problem of degradation in appearance.

Then, conventionally, a technique is proposed, in which a fitting adjustment mechanism capable of reducing a level difference of the level difference or the gap between the contact end portions is provided in the apparatus main body, and the fitting adjustment mechanism includes a lift member and an operation part to shift the lift member upward and downward.

However, the above conventional structure has a new problem that the structure is complicated and a manufacturing cost is increased.

SUMMARY

In accordance with an aspect of the present disclosure, an opening/closing cover attachment structure couples an edge of an opening/closing cover to a cover attaching body in a turnable manner. The opening/closing cover attachment structure includes a first hinge, a second hinge and a holding part. The first hinge and the second hinge are disposed on the edge of the opening/closing cover via an interval. The holding part is disposed outside between the first hinge and the second hinge, and capable of holding the opening/closing cover in a closing state and releasing the holding. Hinge axes of the first hinge and the second hinge are sifted each other in a front-and-rear direction of the opening/closing cover, such that it becomes possible to reduce a level difference between contact end portions of the opening/closing cover in the closing state and the cover attaching body.

The above and other objects, features, and advantages of the present disclosure will become more apparent from the following description when taken in conjunction with the accompanying drawings in which a preferred embodiment of the present disclosure is shown by way of illustrative example.

DETAILED DESCRIPTION

Hereinafter, with reference to the attached drawings, one embodiment of the present disclosure will be described.

Figure 1:
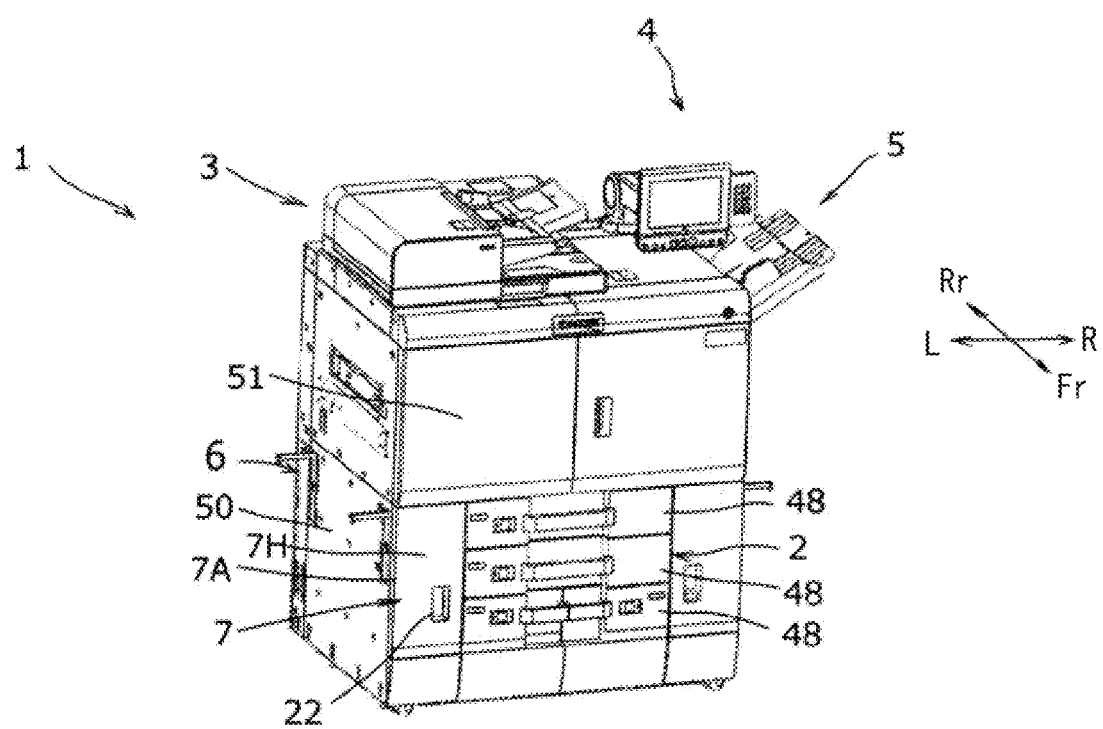
FIG. 1 is a perspective view showing an image forming apparatus.

As shown in FIG. 1, for example, an image forming apparatus 1 of the present embodiment is a multifunctional peripheral, and includes a sheet feeding part 2, an image reading part 3 (a scanning part), an operation part 4, an image forming part, a fixing part (both are not shown), and a discharge part 5. The image forming part and the fixing part are respectively stored in the center portion and the lower portion of an apparatus main body 6. In the embodiment, a left side, a right side, a front side and a rear side of the image forming apparatus 1 are respectively called "a left side", "a right side", "a front side" and "a rear side" simply.

The sheet feeding part 2 includes a plurality of sheet feeding devices 48 to feed a sheet to the image forming part. The image reading part 3 reads a document as an image. To the operation part 4, various operations of the image forming apparatus 1 are input by a user.

The image forming part includes a photosensitive drum, a charging device, a development device and a transferring roller (they are not shown) which are disposed around the photosensitive drum. In the image forming part, a toner image is transferred to the sheet fed from the sheet feeding part 2, based on image data read by the image reading part 3 or image data sent from an external terminal.

The fixing part includes a fixing roller and a pressure roller (both are not shown) which are rotated with coming into contact with each other, and fixes the toner image transferred to the sheet in the image forming part, to the sheet. To the discharge part 5, the sheet on which the image is formed is discharged from the fixing part.

Figure 2:
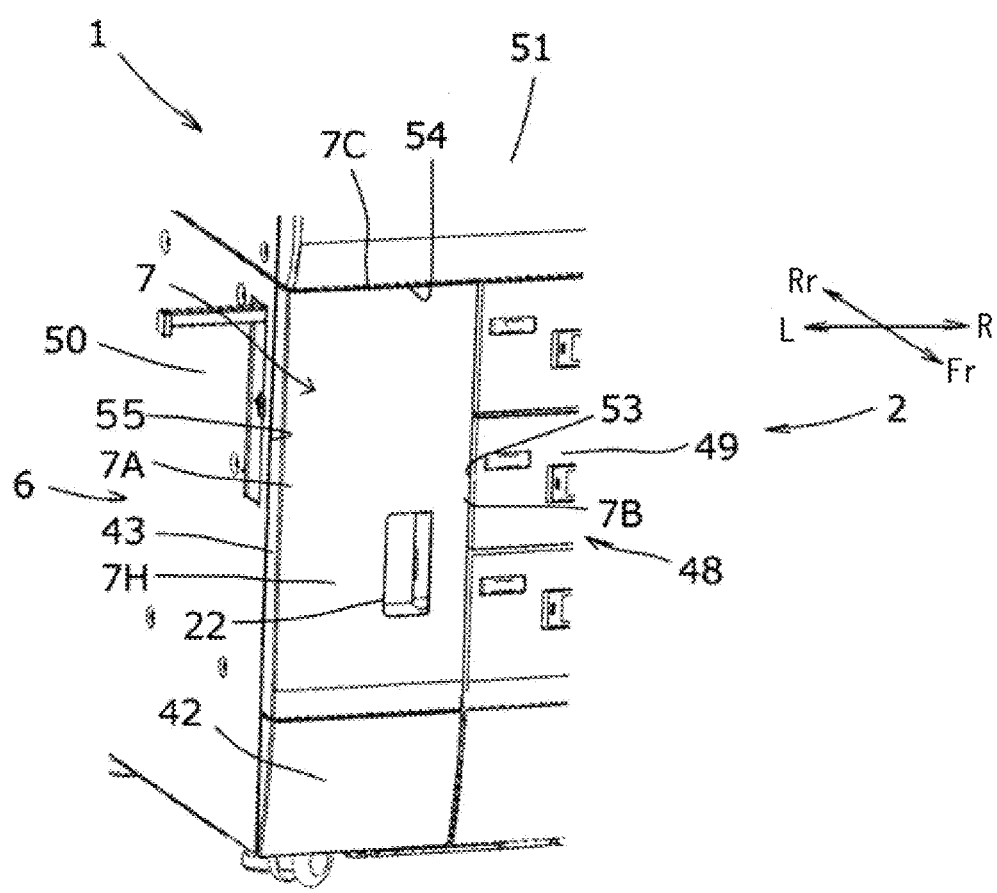
FIG. 2 is a perspective view showing an opening/closing cover provided in a left lower portion of the image forming apparatus and its peripheral structure.
Figure 3:
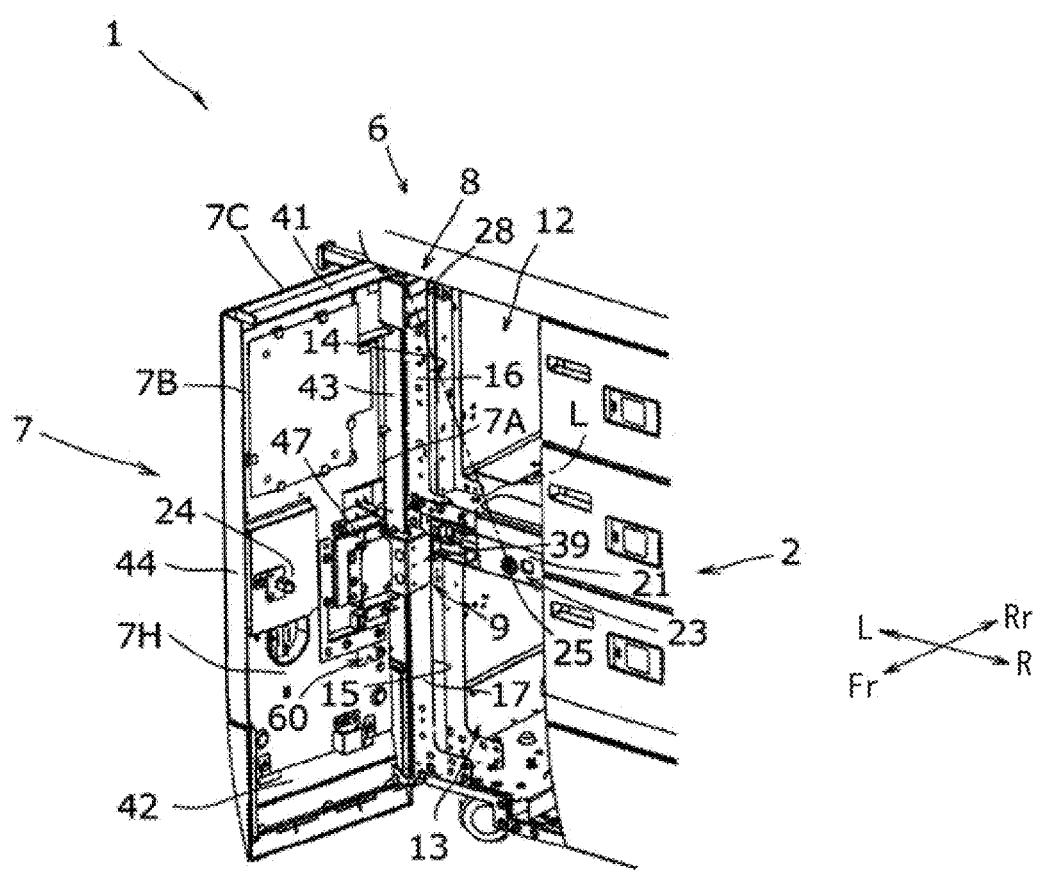
FIG. 3 is a perspective view showing the opened opening/closing cover and its peripheral structure.

[Structure of an opening/closing cover 7 and its periphery] As shown in FIG. 2 and FIG. 3, the apparatus main body 6 (corresponding to a cover attaching body) has a pair of upper and lower storage parts 12 and 13 in which various members of the image forming apparatus 1 are stored, on the left side portion of the front face portion. The upper and lower storage parts 12 and 13 are opened to the front face to form a rectangular upper opening 14 and a rectangular lower opening 15 in the apparatus main body 6.

A strip plate shaped upper frame plate 16 is attached along the left side portion and the lower portion of the upper opening 14, and a strip plate shaped lower frame plate 17 is attached along the left side portion and the upper portion of the lower opening 15. The upper frame plate 16 and the lower frame plate 17 are independently formed.

A rectangular opening/closing cover 7 is attached to the apparatus main body 6 so as to open and close the upper opening 14 and the lower opening 15 together. In detail, the left side edge 7A (corresponding to one side edge) of the opening/closing cover 7 is coupled to the upper frame plate 16 and the lower frame plate 17 with an upper first hinge 8 and a lower second hinge 9 in a rotatable manner around a first hinge axis O1 and a second hinge axis O2 (refer to FIG. 17 and FIG. 20). That is, the opening/closing cover 7 is configured to be openable and closable in a turnable manner in the front-and-rear direction of the image forming apparatus 1.

To the upper frame plate 16 and the lower frame plate 17 disposed between the upper and lower storage parts 12 and 13, a supporting plate 21 to which a magnet 25, described below, is fixed and supported is attached.

The opening/closing cover 7 is formed into a rectangular shape long in the upper-and-lower direction. The main body 7H of the opening/closing cover 7 has a lower portion 42 formed into a gently curved plate curved to the back side (the rear side) of the opening/closing cover 7 toward the lower edge. The lower end of the opening/closing cover 7 is positioned near the lower end portion of the apparatus main body 6.

Further, from the upper edge, one side edge 7A (the left side edge) and the other side edge 7B (the right side edge) of the opening/closing cover 7, a first upper wall 41, a left first side wall 43 and a right first side wall 44 are respectively protruded to the rear side of the opening/closing cover 7. The opening/closing cover 7 has a recess 22 (refer to FIG. 2) gripped by a user for opening and closing operation at the center portion in the upper-and-lower direction.

As shown in FIG. 3, a holding part 23 is formed on a lateral side between the first hinge 8 and the second hinge 9 (corresponding to an outside between the first hinge 8 and the second hinge 9), which allows holding the opening/closing cover 7 in a closing state and releasing the holding. The holding part 23 includes a magnet attaching part 24 and the magnet 25 which are distributed in the rear face of the main body 7H of the opening/closing cover 7 and the supporting plate 21. In the present embodiment, the magnet attaching part 24 is provided on the rear face of the main body 7H of the opening/closing cover 7, and the magnet 25 is provided in the supporting plate 21. Alternatively, the magnet 25 may be provided on the rear face of the main body 7H of the opening/closing cover 7, and the magnet attaching part 24 may be provided in the supporting plate 21. By forming the holding part 23 by the magnet attaching part 24 and the magnet 25, it becomes possible to make the structure of the holding part 23 simple and to reduce the cost.

Figure 4:
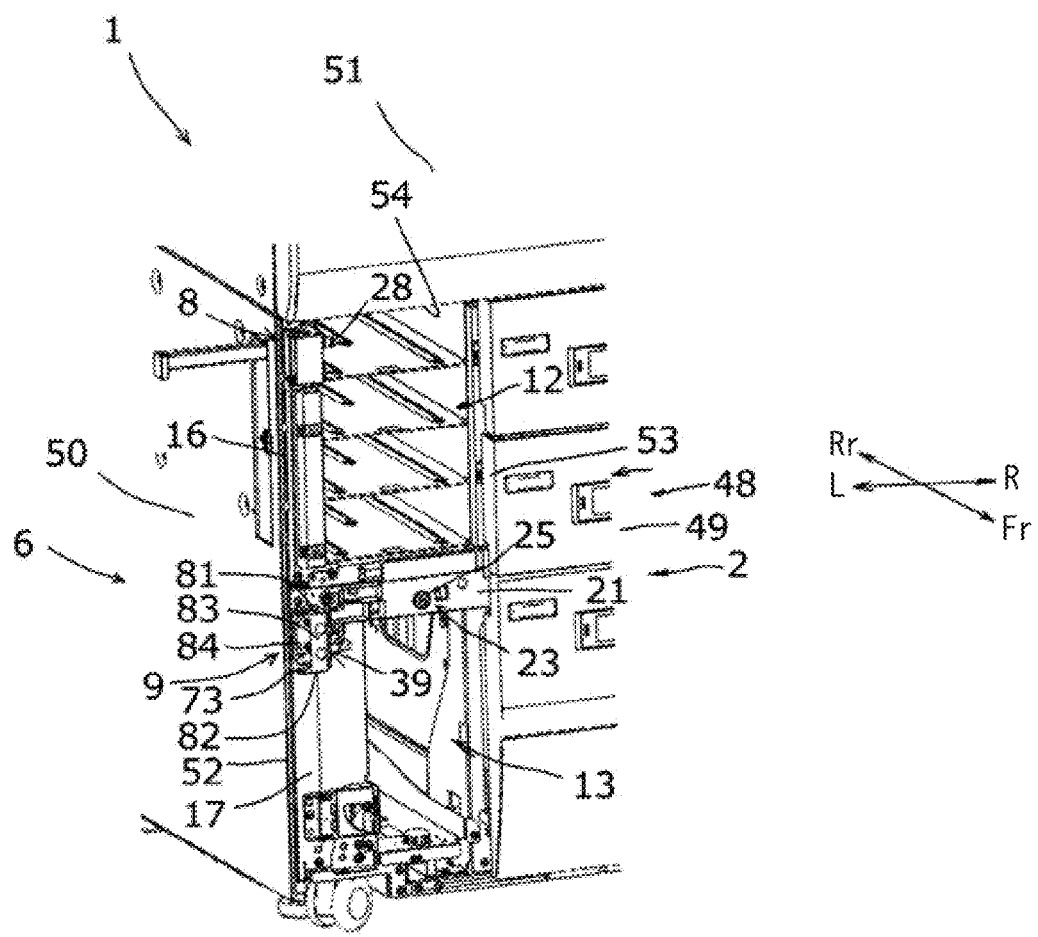
FIG. 4 is a perspective view showing the peripheral portion of the detached opening/closing cover.
Figure 6:
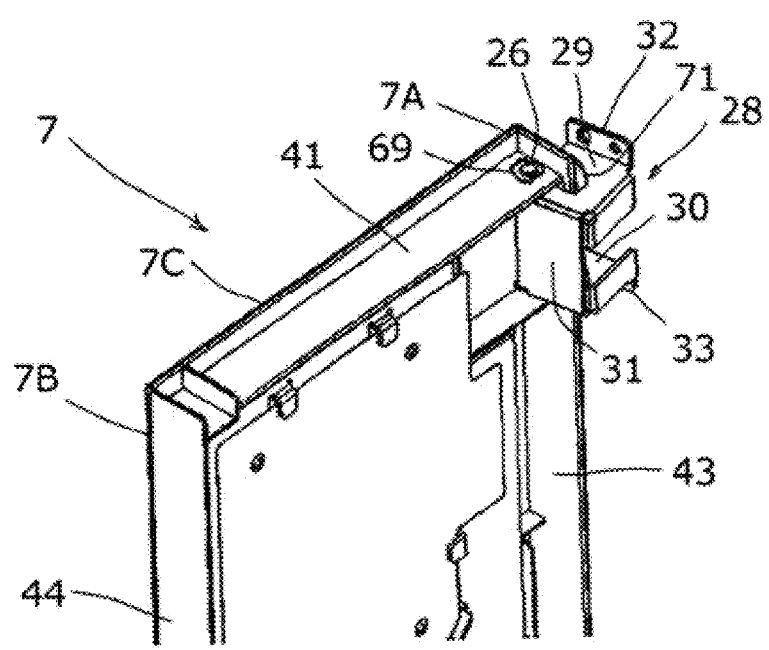
FIG. 6 is a perspective view showing the first hinge in a state where the opening/closing cover is opened and its peripheral structure, when viewed from a rear side on a side of the other side edge of the opening/closing cover.

As shown in FIG. 2, FIG. 4 and FIG. 6, the left first side wall 43 (corresponding to a contact end portion) of the opening/closing cover 7 comes into contact with a front end portion 55 (corresponding to a contact end portion) of a side face cover 50 of the apparatus main body 6. The right first side wall 44 (corresponding to a contact end portion) of the opening/closing cover 7 comes into contact with a side edge 53 (corresponding to a contact end portion) of a front cover 49 of each sheet feeding device 48. The upper end 7C (corresponding to a contact end portion) of the opening/closing cover 7 comes into contact with a lower end portion 54 (corresponding to a contact end portion) of a front face cover 51 of the apparatus main body 6.

Figure 5:
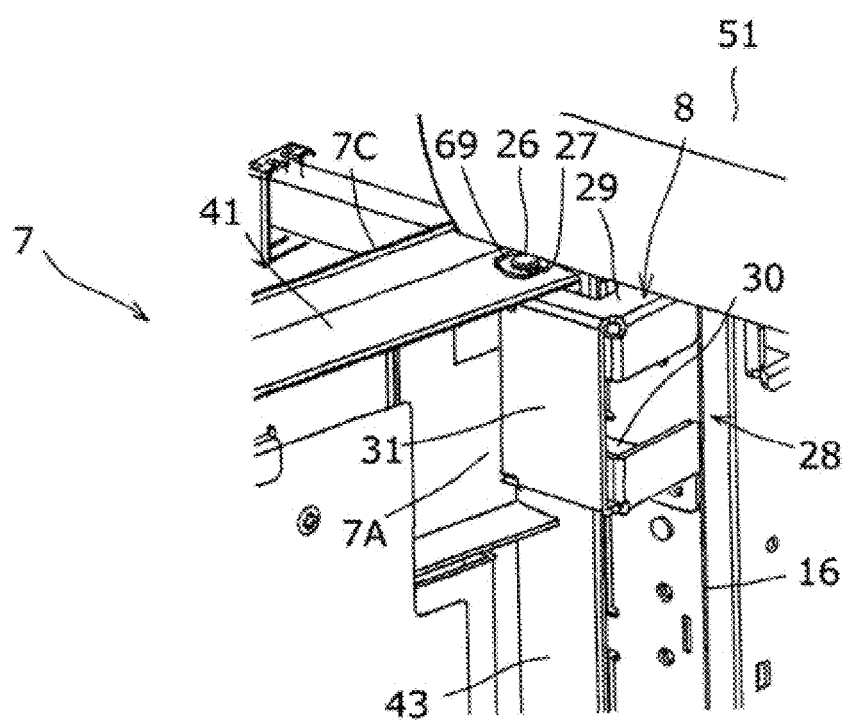
FIG. 5 is a perspective view showing a first hinge.
Figure 11:
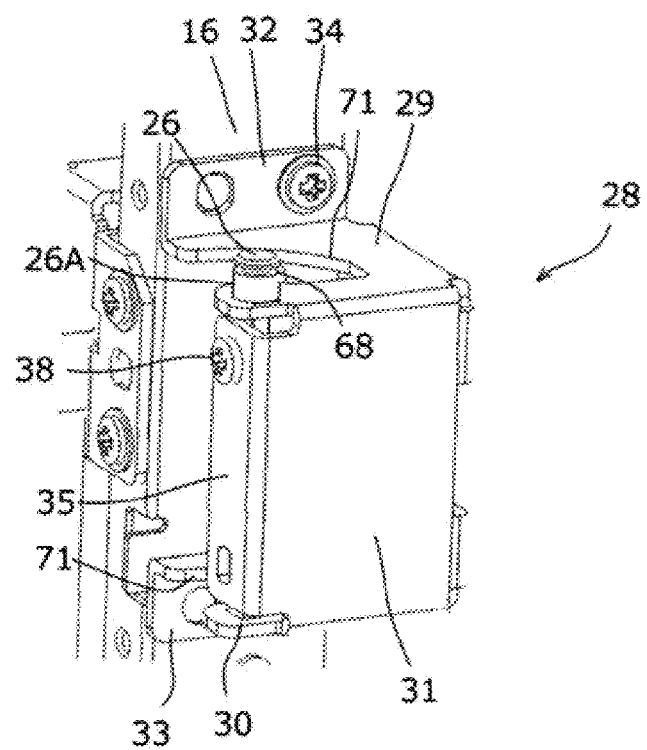
FIG. 11 is a perspective view showing the first hinge.

(Structure of the first hinge 8). As shown in FIG. 2 to FIG. 5, the first hinge 8 includes a first hinge pin 26 provided in the apparatus main body 6 and a first pin insertion hole 27 (refer to FIG. 5) provided in the left end portion of the first upper wall 41 of the opening/closing cover 7. As shown in FIG. 3, FIG. 5 and FIG. 11, to the upper end portion of the upper frame plate 16, a first supporting bracket 28 made of metal plate is provided so as to support the first hinge pin 26.

As shown in FIG. 5 to FIG. 11, the first supporting bracket 28 has a second upper wall 29, a second lower wall 30, a first rear wall 31, an upper first attachment flange 32 and a lower first attachment flange 33. The plate faces of the second upper wall 29 and the second lower wall 30 face each other in the upper-and-lower direction. The first rear wall 31 couples the apex portions of the second upper wall 29 and the second lower wall 30. The upper first attachment flange 32 extends upward from the base end portion of the second upper wall 29. The lower first attachment flange 33 extend downward from the base end portion of the second lower wall 30. The upper first attachment flange 32 and the lower first attachment flange 33 are fastened to the upper end portion of the upper frame plate 16 with bolts 34.

Figure 12:
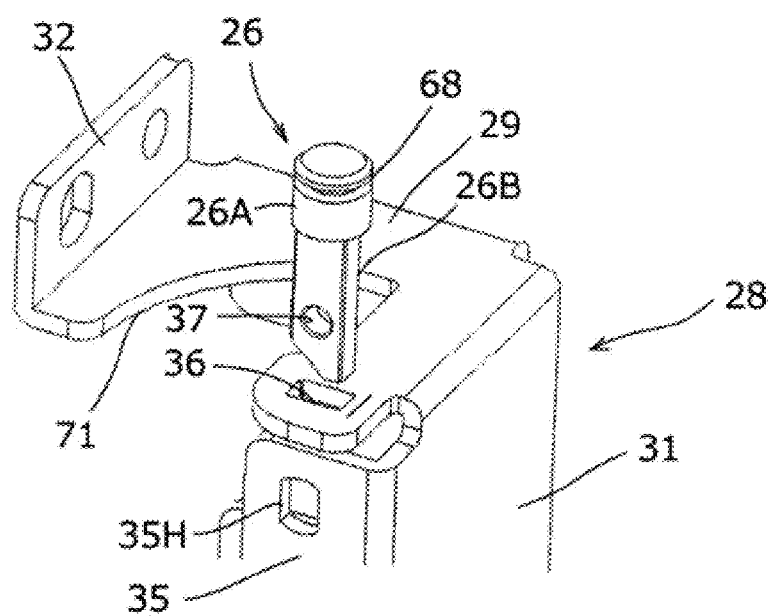
FIG. 12 is a perspective view showing the first hinge before a fitting portion of a hinge pin is inserted into a pin fitting hole of a first supporting bracket.

From the left side portion of the first rear wall 31, a second side wall 35 extends toward the upper flame plate 16. Between the second side wall 35 and the upper flame plate 16, a space is formed. As shown in FIG. 12, in the upper end portion of the second side wall 35, an oval bolt insertion hole 35H is formed. In the wall portion of the second upper wall 29 positioned near the upper end portion of the second side wall 35, a pin fitting hole 36 is formed, into which a fitting portion 26B, described below, of the first hinge pin 26 is inserted and fitted.

Figure 7:
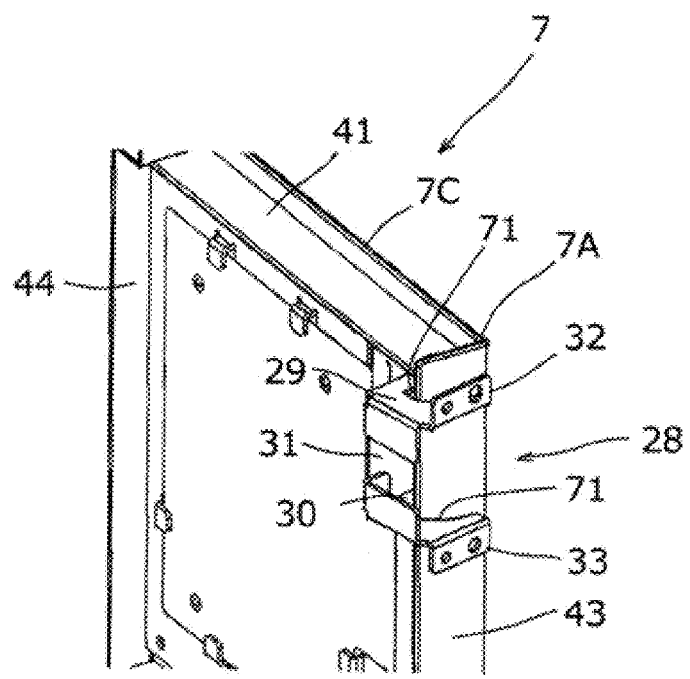
FIG. 7 is a perspective view showing the first hinge in the state where the opening/closing cover is opened and its peripheral structure, when viewed from a rear side on a side of one side edge of the opening/closing cover.
Figure 8:
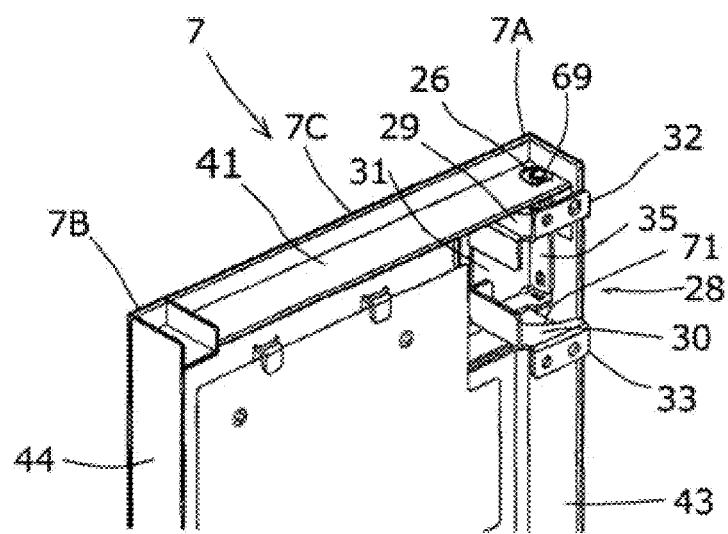
FIG. 8 is a perspective view showing the first hinge in a state where the opening/closing cover is closed and its peripheral structure, when viewed from a rear side on a side of the other side edge of the opening/closing cover.
Figure 9:
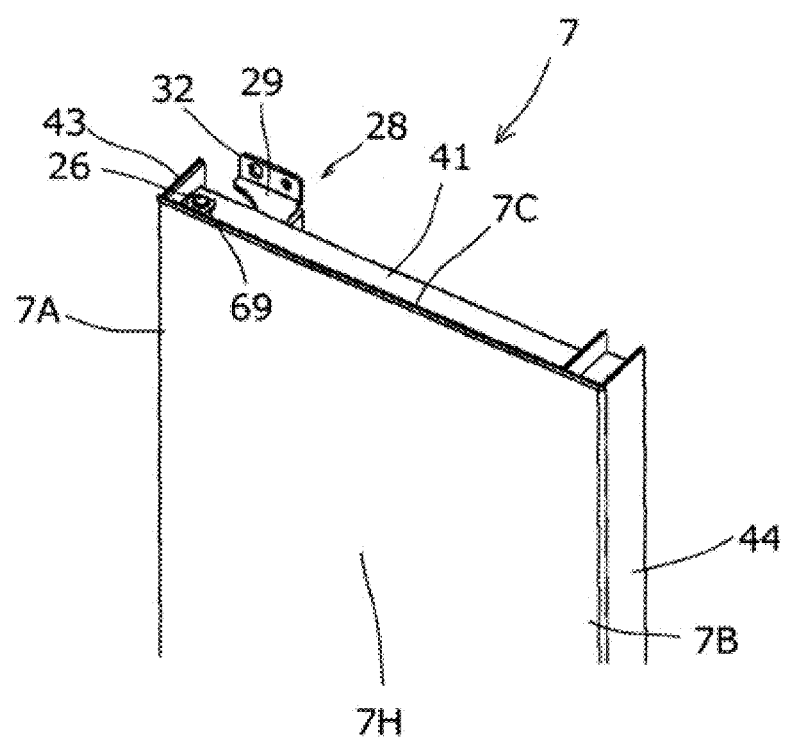
FIG. 9 is a perspective view showing the first hinge in the state where the opening/closing cover is closed and its peripheral structure, when viewed from a front side on a side of the other side edge of the opening/closing cover.
Figure 10:
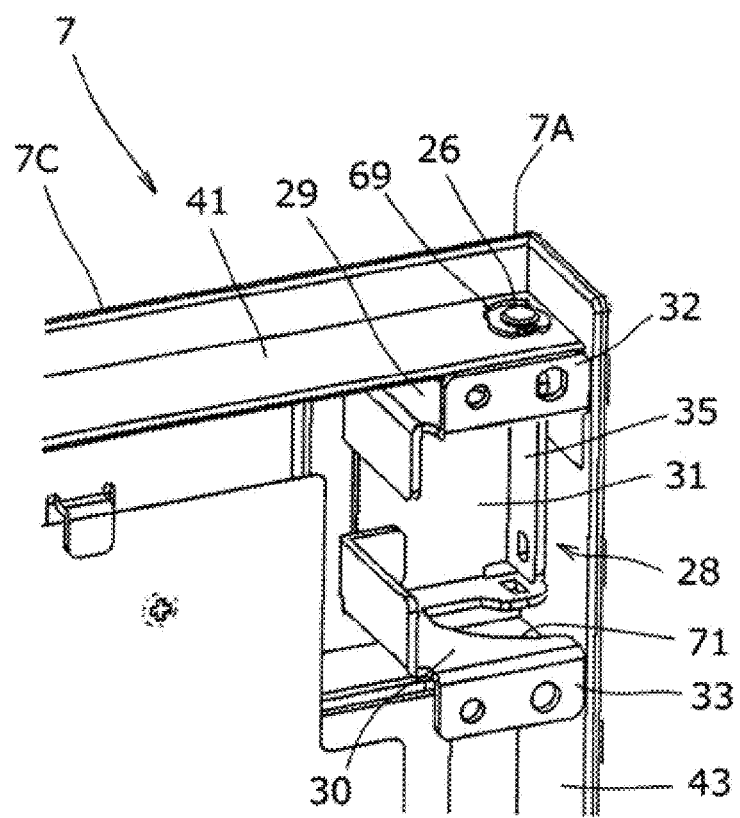
FIG. 10 is an enlarged perspective view showing the first hinge in the state where the opening/closing cover is closed and its peripheral structure, when viewed from a rear side on a side of one side edge of the opening/closing cover.

As shown in FIG. 7, FIG. 10 and FIG. 11, the second upper wall 29 and the second lower wall 30 have first notches 71 into which the upper end portion of the left first side wall 43 of the opening/closing cover 7 enters as the opening/closing cover 7 is opened.

Figure 15:
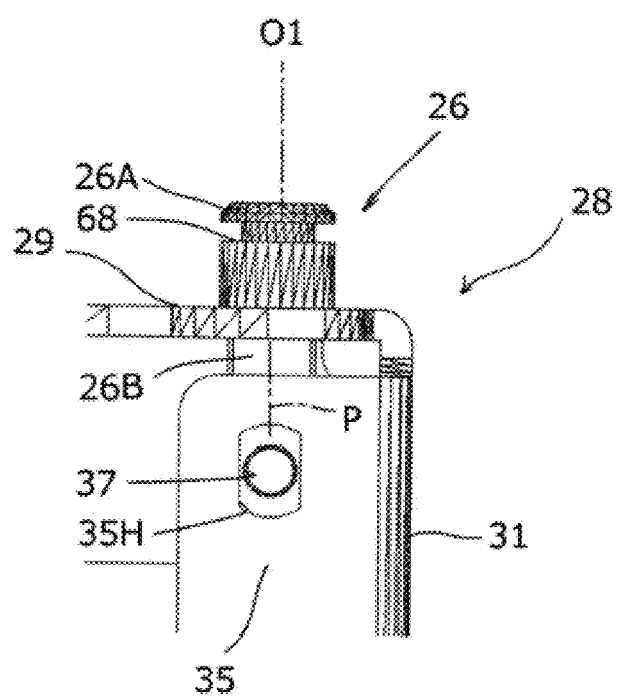
FIG. 15 is a side view showing the first hinge (the first state) in the state where the fitting portion of the hinge pin is inserted into the pin fitting hole of the first supporting bracket.
Figure 17:
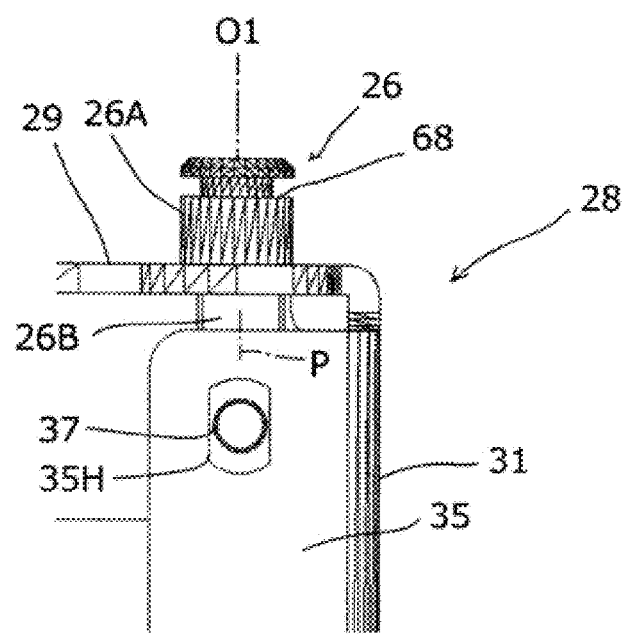
FIG. 17 is a side view showing the first hinge (the second state) in the state where the fitting portion of the hinge pin is inserted into the pin fitting hole of the first supporting bracket.

As shown in FIG. 12, the first hinge pin 26 has an insertion portion 26A having a circular cross section inserted into the first pin insertion hole 27 and the fitting portion 26B inserted into the pin fitting hole 36. The insertion portion 26A has a circlip fitting groove 68, and the fitting portion 26B has a female screw portion 37 perpendicular to a longitudinal direction (an axial direction) of the fitting portion 26B. Each of the fitting portion 26B and the pin fitting hole 36 is formed to have a non-circular cross section, that is, a rectangular cross section. As shown in FIG. 15 and FIG. 17, an axis of the insertion portion 26A, that is the first hinge axis O1 and an axis P of the fitting portion 26B are shifted each other, and the insertion portion 26A is eccentrically disposed with respect to the fitting portion 26B.

Figure 13:
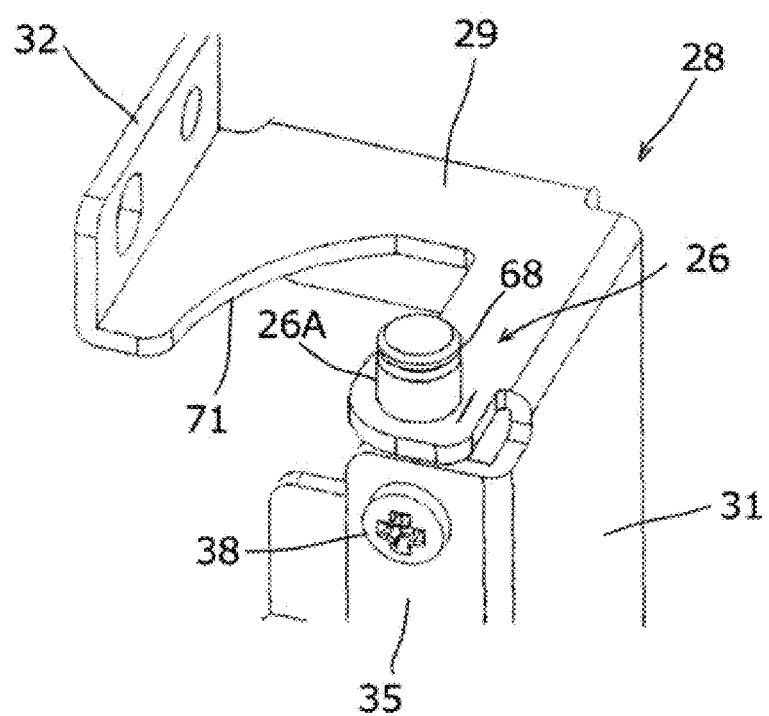
FIG. 13 is a perspective view showing the first hinge in a state where the fitting portion of the hinge pin is inserted into the pin fitting hole of the first supporting bracket.
Figure 14:
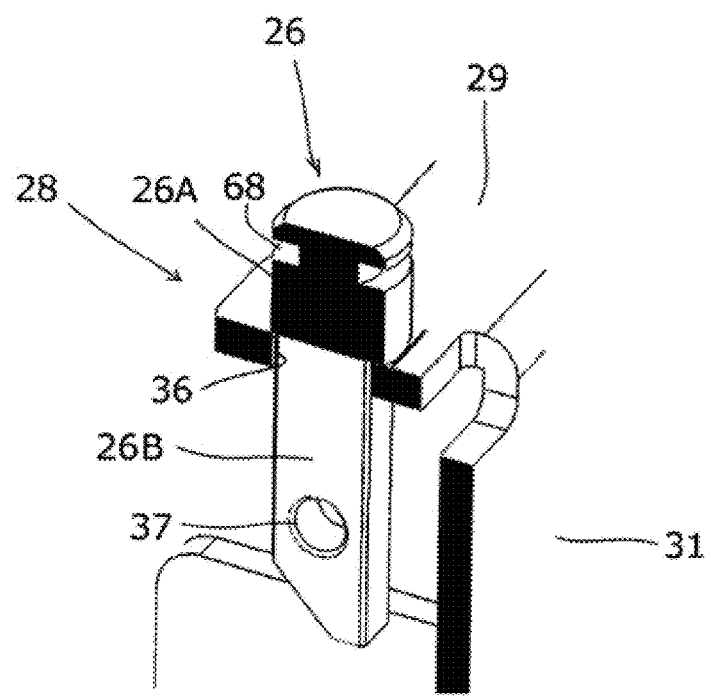
FIG. 14 is a partially cut out sectional view showing the first hinge (a first state) in the state where the fitting portion of the hinge pin is inserted into the pin fitting hole of the first supporting bracket.

The first hinge pin 26 is attached to the first supporting bracket 28 in the following manner.
(1) As shown in FIG. 12 and FIG. 14, the insertion portion 26B of the first hinge pin 26 is inserted and fitted into the pin fitting hole 36 of the first supporting bracket 28 from above the first supporting bracket 28.
(2) As shown in FIG. 11, FIG. 13 and FIG. 15, a bolt 38 is inserted into the oval bolt insertion hole 35H of the second side wall 35 of the first supporting bracket 28, and then the male screw portion of the bolt 38 is screwed with the female screw portion 37 of the fitting portion 26B. Then, the first hinge pin 26 is fixed and supported by the first supporting bracket 28.

As shown in FIG. 5 and FIG. 6, after the insertion portion 26A is inserted and fitted into the first pin insertion hole 27 formed in the left end portion of the first upper wall 41 of the opening/closing cover 7, a circlip 69 is fitted into the circlip fitting groove 68 of the insertion portion 26A.

Figure 16:
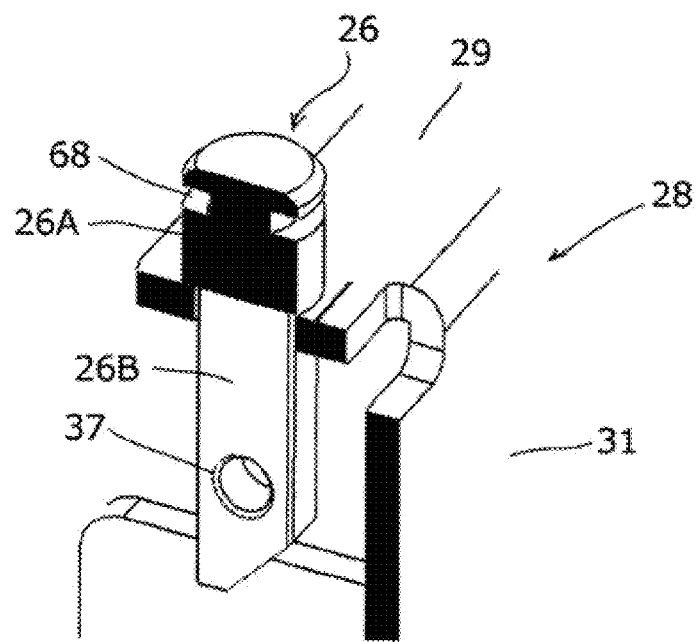
FIG. 16 is a partially cut out sectional view showing the first hinge (a second state) in the state where the fitting portion of the hinge pin is inserted into the pin fitting hole of the first supporting bracket.

FIG. 14 and FIG. 15 show a first state where the first hinge pin 26 is held in a first posture and the fitting portion 26B is inserted and fitted into the pin fitting hole 36. The present embodiment is configured to be switched between the first state and a second state where the first hinge pin 26 is held in a second posture where the first hinge pin 26 is turned by 180 degrees in the circumferential direction from the first posture and the fitting portion 26B is inserted and fitted into the pin fitting hole 36 as shown in FIG. 16 and FIG. 17.

The insertion portion 26A (refer to FIG. 17) in the second state is shifted in the front-and-rear direction of the opening/closing cover 7 (the front-and-rear direction of the image forming apparatus 1) with respect to the insertion portion 26A in the first state. In detail, the insertion portion 26A in the second state is shifted by 1 mm to the rear side of the opening/closing cover 7 with respect to the insertion portion 26A in the first state. A shift amount may be a value other than the value (1 mm).

As described above, by shifting the first hinge axis O1 of the first hinge 8 in the front-and-rear direction of the opening/closing cover 7 with respect to the second hinge axis O2 of the second hinge 9, it becomes possible to reduce a level difference or a gap between the contact end portion of the opening/closing cover 7 in the closing state and the contact end portion of the apparatus main body 6. That is, it becomes possible to reduce a level difference or a gap between the left first side wall 43 of the opening/closing cover 7 and the front end portion 55 of the side face cover 50 of the apparatus main body 6, between the right first side wall 44 of the opening/closing cover 7 and the side edge 53 of the front cover 49 of each sheet feeding device 48, and between the upper end 7C of the opening/closing cover 7 and the lower end portion 54 of the front face cover 51 of the apparatus main body 6. Because it is switched into the first state and the second state by turning the first hinge pin 26 in the circumferential direction by 180 degrees, it becomes possible to secure a shift amount of the first hinge axis O1 of the first hinge 8 in the front-and-rear direction of the opening/closing cover 7.

Figure 20:
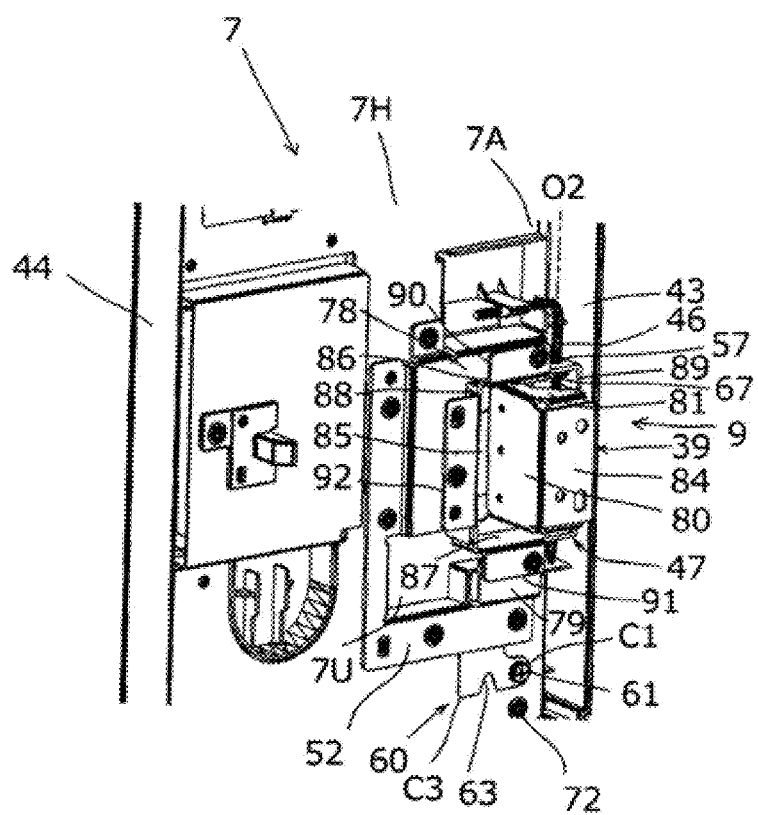
FIG. 20 is a perspective view showing the second hinge in the state where the opening/closing cover is closed and its peripheral structure, when viewed from a rear side of the opening/closing cover (the hinge pin is shown).

[Structure of the second hinge 9] As shown in FIG. 3 and FIG. 20, the second hinge 9 includes a second hinge pin 46 provided in the middle portion in the upper-and-lower direction of the side edge 7A of the opening/closing cover 7 and a second pin insertion hole 67 provided in the apparatus main body 6 and into which the second hinge pin 46 is inserted.

Figure 18:
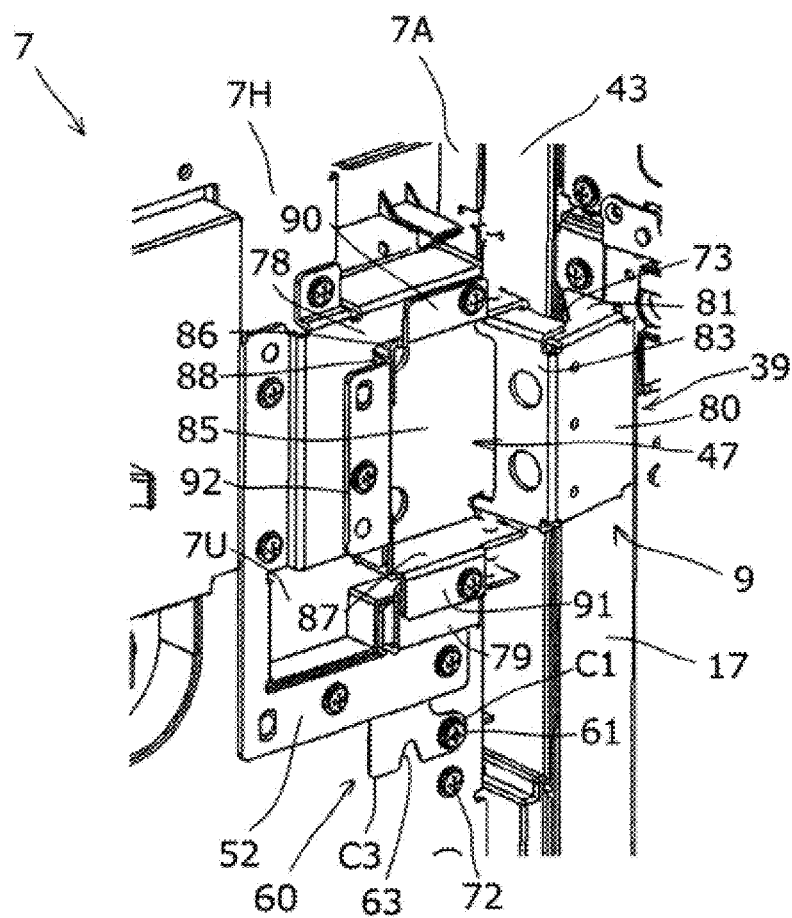
FIG. 18 is a perspective view showing a second hinge in the state where the opening/closing cover is opened and its peripheral structure, when viewed from a rear side of the opening/closing cover.

As shown in FIG. 4 and FIG. 20, in the upper end portion of the lower frame plate 17, a second supporting bracket 39 made of metal plate and provided with the second pin insertion hole 67 is fixed. As shown in FIG. 4 and FIG. 18, the second supporting bracket 39 is formed into an approximately U-shape in a horizontal cross section opened to the left side.

The second supporting bracket 39 has a second rear wall 80, a third upper wall 81, a third lower wall 82 (refer to FIG. 4), a front third side wall 83 and a rear third side wall 84. The plate faces of the second rear wall 80 are oriented in the left-and-right direction. The third upper wall 81 and the third lower wall 82 extend leftward from the upper end portion and the lower end portion of the second rear wall 80 respectively. The front third side wall 83 and the rear third side wall 84 extend leftward from the side portions of the second rear wall 80. The rear third side wall 84 is fastened to the upper end portion of the lower frame plate 17 with bolts.

As shown in FIG. 20, the second pin insertion hole 67 is formed in the front and left corner portion of the image forming apparatus 1 of four corners of the third upper wall 81.

As shown in FIG. 4 and FIG. 18, the third upper wall 81 and the third lower wall 82 have second notches 73 into which the middle portion in the upper-and-lower direction of the left first side wall 43 of the opening/closing cover 7 enters as the opening/closing cover 7 is opened.

As shown in FIG. 3 and FIG. 18 to FIG. 20, on the rear side of the middle portion in the upper-and-lower direction of the opening/closing cover 7, a third supporting bracket 47 which supports the second hinge pin 46 is provided via a board 52. The board 52 is overlapped on the rear face 7U (corresponding to a supporting bracket attachment face) of the main body 7H of the opening/closing cover 7 and fixed thereto by a bolt.

The third supporting bracket 47 has a rectangular bottom wall 85, a fourth upper wall 86, a fourth lower wall 87, fourth side walls 88 and 89. The fourth upper wall 86 and the fourth lower wall 87 stand along the upper end portion and the lower end portion of the bottom wall 85 respectively. The fourth side walls 88 and 89 stand along the left and right side portions of the bottom wall 85 respectively. An upper second attachment flange 90 extends upward from one end portion of the fourth upper wall 86, and a lower second attachment flange 91 extends downward from one end portion of the fourth lower wall 87. The upper second attachment flange 90 and the lower second attachment flange 91 are fastened to upper and lower standing portions 78 and 79 provided in the board 52 with bolts.

Figure 19:
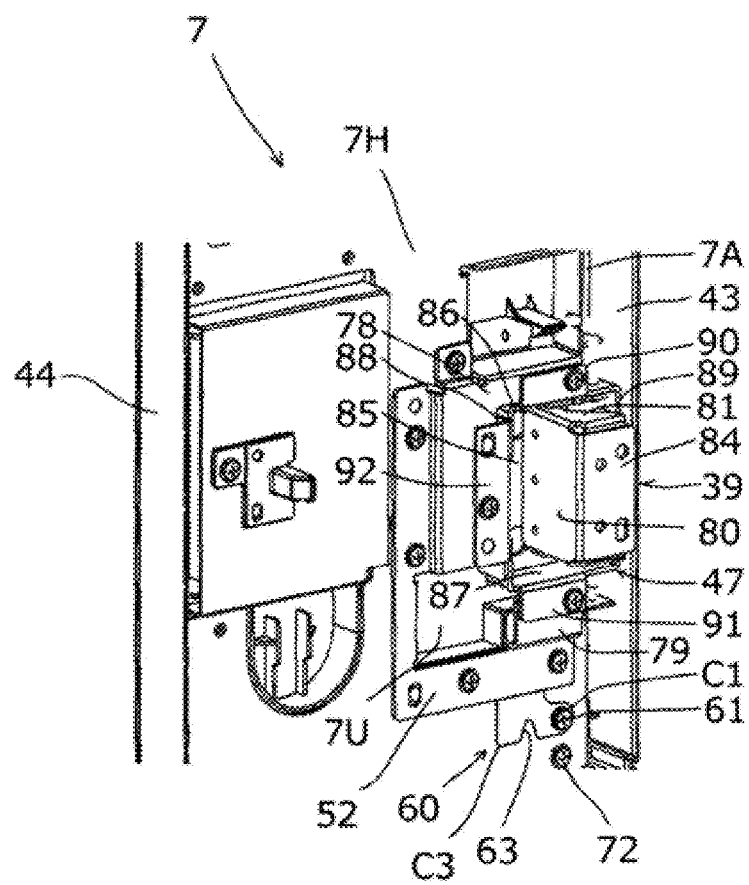
FIG. 19 is a perspective view showing the second hinge in the state where the opening/closing cover is closed and its peripheral structure, when viewed from a rear side of the opening/closing cover (the hinge pin is not shown).

As shown in FIG. 20, in one end portions of the fourth upper wall 86 and the fourth lower wall 87, third pin insertion holes 57 are formed. The second hinge pin 46 is inserted into the third pin insertion holes 57 and the second pin insertion hole 67. As shown in FIG. 18 and FIG. 19, the front third side wall 83 (refer to FIG. 18) of the second supporting bracket 39 enters a recess of the third supporting bracket 47 (a recess surrounded by the fourth upper wall 86, the fourth lower wall 87, the fourth side walls 88 and 89) as the opening/closing cover 7 is closed (refer to FIG. 19).

Figure 21:
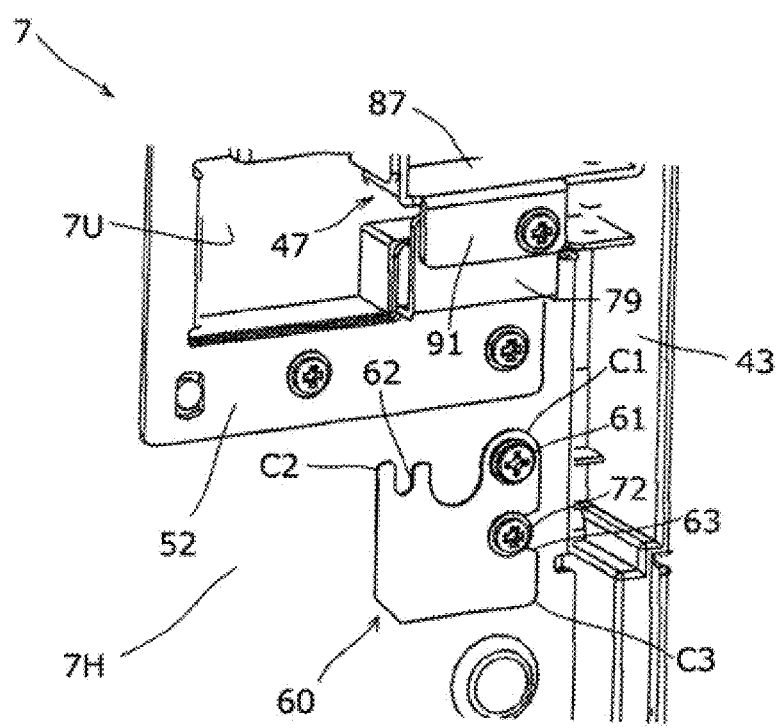
FIG. 21 is a perspective view showing the second hinge in a spacer non-interposition state and its peripheral structure.
Figure 22:
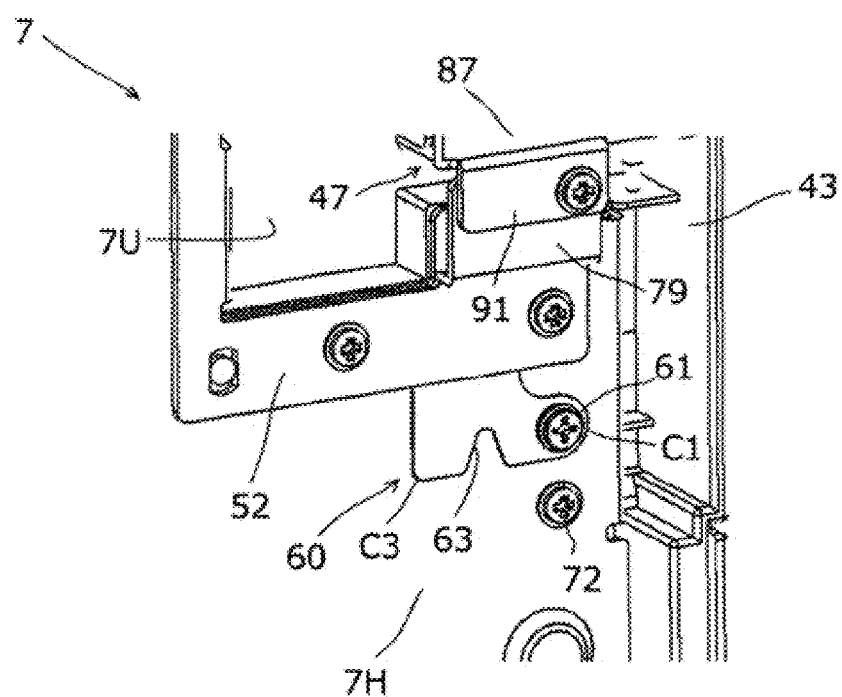
FIG. 22 is a perspective view showing the second hinge in a spacer interposition state and its peripheral structure.

As shown in FIG. 21 and FIG. 22, a rectangular plate-shaped spacer 60 is fixed to the main body 7H of the opening/closing cover 7 with a first bolt 61, which is interposable and is not interposable between the rear face of the lower end portion of the board 52 and the rear face of the main body 7H of the opening/closing cover 7. The spacer 60 has a bolt insertion hole at the first corner portion C1 and a third notch 62 at the second corner portion C2 adjacent to the first corner portion C1. Further, the spacer 60 has a fourth notch 63 between the first corner portion C1 and the third corner portion C3 adjacent to the first corner portion C1.

FIG. 21 shows a non-interposition state where the spacer 60 is not interposed between the rear face of the lower end portion of the board 52 and the rear face of the main body 7H of the opening/closing cover 7. At this time, the entire of the spacer is positioned below the board 52. The first bolt 61 is inserted into the bolt insertion hole of the first corner portion C1, a second bolt 72 is inserted into the fourth notch 63, and the spacer 60 is thus fixed to the main body 7H of the opening/closing cover 7 with the first bolt 61 and the second bolt 72.

FIG. 22 shows an interposition state where the spacer 60 is interposed between the rear face of the lower end portion of the board 52 and the rear face of the main body 7H of the opening/closing cover 7. When the spacer 60 is interposed between the rear face of the lower end portion of the board 52 and the rear face of the main body 7H of the opening/closing cover 7, bolt fastening force of the board 52 and the spacer 60 to the main body 7H of the opening/closing cover 7 is weakened. Then, the spacer 60 is turned upward around the first bolt 61 and interposed between the rear face of the lower end portion of the board 52 and the rear face of the main body 7H of the opening/closing cover 7. Thereafter, the bolt fastening force is strengthened to nip the spacer 60 between the lower end portion of the board 52 and the main body 7H of the opening/closing cover 7.

As described above, in the present embodiment, it is configured to be switched between the interposition state where the spacer 60 is interposed between the rear face of the lower end portion of the board 52 and the rear face of the main body 7H of the opening/closing cover 7 and the non-interposition position where the spacer 60 is not interposed between the rear face of the lower end portion of the board 52 and the rear face of the main body 7H of the opening/closing cover 7. The second hinge pin 46 in the non-interposition state is shifted in the front-and-rear direction of the main body 7H of the opening/closing cover 7 (to the front side of the image forming apparatus 1) with respect to the second hinge pin 46 in the interposition state.

[Attachment of the opening/closing cover 7 to the apparatus main body 6] Before the opening/closing cover 7 is attached to the apparatus main body 6, the opening/closing cover 7 is set in the first state (refer to FIG. 14 and FIG. 15) such that the fitting portion 26B of the first hinge pin 26 is inserted and fitted into the pin fitting hole 36 of the first supporting bracket 28 in the first posture, and the spacer 60 is set in the non-interposition state (refer to FIG. 22).

Under the state, the opening/closing cover 7 is attached to the apparatus main body 6. After the opening/closing cover 7 is attached to the apparatus main body 6, if a level difference or a gap is formed between the contact end portions of the closed opening/closing cover 7 and the apparatus main body 6, the opening/closing cover 7 is detached from the apparatus main body 6, and then at least one of methods [V] and [W] described below is applied to reduce the level difference or the gap.

[V] The fitting portion 26B of the first hinge pin 26 is removed from the pin fitting hole 36 of the first supporting bracket 28. Then, the first hinge pin 26 is turned from the first posture in the circumferential direction by 180 degrees into the second posture, and then the fitting portion 26B is inserted and fitted into the pin fitting hole 36 (the second state, refer to FIG. 16 and FIG. 17). After that, the insertion portion 26A of the first hinge pin 26 is inserted into the first pin insertion hole 27, and then the opening/closing cover 7 is attached to the apparatus main body 6.

[W] The bolt fastening force of the board 52 and the spacer 60 to the main body 7H of the opening/closing cover 7 is weakened. Then, the spacer 60 is turned downward around the first bolt 61, and then removed downward from between the rear face of the lower end portion of the board 52 and the rear face of the main body 7H of the opening/closing cover 7. After that, the bolt fastening force is increased to bring the lower end portion of the board 52 into pressure contact with the main body 7H of the opening/closing cover 7 (the non-interposition state, refer to FIG. 21). Further, the second bolt 72 is inserted through the fourth notch 63, and the spacer 60 is fixed to the main body 7H of the opening/closing cover 7 with the first bolt 61 and the second bolt 72.

Figure 24:
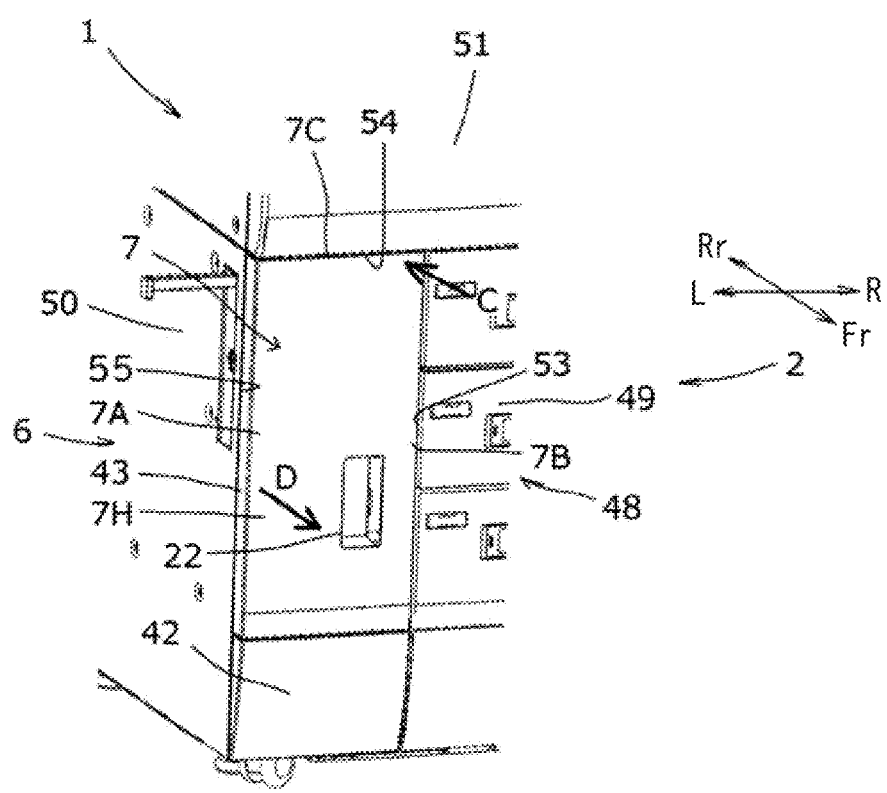
FIG. 24 is a perspective view shown an action and effect in the spacer non-interposition state.

For example, under a state where the opening/closing cover 7 is attached to the apparatus main body 6, in a case where the upper end portion (refer to FIG. 3) of the right first side wall 44 of the opening/closing cover 7 is protruded more forward than a target position and a level difference is formed with respect to the side edge 53 of the front cover 49 of each sheet feeding device 48, the method [W] is applied. As a result, as shown in FIG. 20 and FIG. 24, the opening/closing cover 7 is shifted by a thickness of the spacer 60 in a direction shown by the arrow D (forward) with respect to the second hinge axis O2 of the second hinge 9. Then, the opening/closing cover 7 is turned around a virtual line L (refer to FIG. 3) connecting the first hinge pin 26 to the magnet 25 as a turning axis in a direction shown in the arrow C, and the upper end portion of the right first side wall 44 of the opening/closing cover 7 is shifted in a direction shown by the arrow C (rearward). As a result, it becomes possible to reduce a level difference and to improve the appearance.

Alternatively, for example, in a state where the opening/closing cover 7 is attached to the apparatus main body 6, there is a case where a gap between the lower end portion 43K (refer to FIG. 23) of the left first side wall 43 of the opening/closing cover 7 and the lower end portion 50K (refer to FIG. 23) of the side face cover 50 of the apparatus main body 6 may be too small. If the gap is too small, an interference between the lower end portions 43K and 50K, a so-called kicking, may easily occur as the opening/closing cover 7 is turned to be closed.

Figure 23:
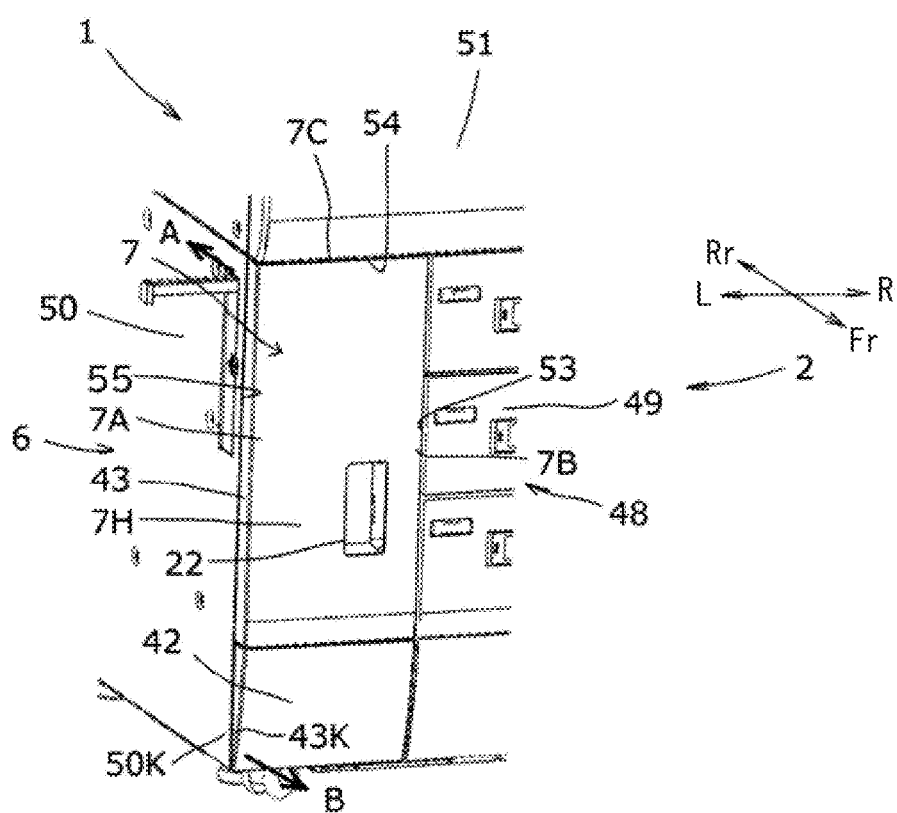
FIG. 23 is a perspective view showing an action and effect in the second state where the fitting portion of the hinge pin of the first hinge is inserted into the pin fitting hole of the first supporting bracket.

In this case, the method [V] is applied. That is, by applying the method [V], as shown in FIG. 17 and FIG. 23, the first hinge axis O1 of the first hinge 8 is slightly shifted in a direction shown by the arrow A (rearward). On the other hand, the lower end portion 43K of the left first side wall 43 of the opening/closing cover 7 is shifted in a direction shown by the arrow B (forward). As a result, it becomes possible to set the gap to a suitable value and to prevent the interference (the kicking). Accordingly, it is particularly advantageous for the configuration of the present embodiment where the lower portion 42 of the opening/closing cover 7 is in a free state where it is not fixed to the apparatus main body 6.

According to the present disclosure, by applying at least one of the methods [V] and [W], it becomes possible to reduce a level difference and a gap between the upper end 7C of the opening/closing cover 7 and the lower end portion 54 of the front face cover 51 of the apparatus main body 6.

As described above, according to the present embodiment, it becomes possible to reduce a level difference between the contact end portions of the opening/closing cover 7 and the apparatus main body 6, to improve the appearance quality, to make the structure simple and to reduce a manufacturing cost.

Another Embodiment (1) The present disclosure may be applied for a configuration where the first hinge 8 and the second hinge 9 are disposed side by side, and the opening/closing cover 7 is turned in the upper-and-lower direction.

(2) In the above embodiment, when the first hinge pin 26 is turned from the first posture to the second posture, the first hinge pin 26 is turned in the circumferential direction by 180 degrees. However, it may be configured such that the first hinge pin 26 is turned from the first posture to the second posture by an angle other than 180 degrees.

(3) The holding part 23 may be formed by members other than the magnet 25 and the magnet attaching part 24.

While the embodiments of the present disclosure have been described, the embodiments are shown by way of example and are not intended to limit the scope of the disclosure.

As described above, the present disclosure is useful for an image forming apparatus, and particularly useful for a copying machine, a facsimile, a printer, a multifunctional peripheral (MFP), and the like.

The invention claimed is:

1. An opening/closing cover attachment structure which couples an edge of an opening/closing cover to a cover attaching body in a turnable manner, the opening/closing cover attachment structure comprising:
a first hinge and a second hinge disposed on the edge of the opening/closing cover via an interval; and
a holding part disposed outside between the first hinge and the second hinge, and capable of holding the opening/closing cover in a closing state and releasing the holding, wherein
the first hinge includes a hinge pin provided in one of the cover attaching body and the edge of the opening/closing cover and a pin insertion hole provided in the other of the cover attaching body and the edge of the opening/closing cover,
the hinge pin has an insertion portion inserted into the pin insertion hole and a fitting portion inserted into a pin fitting hole provided in the one of the cover attaching body and the edge of the opening/closing cover,
the fitting portion and the pin fitting hole are formed to have a non-circular cross section, and the insertion portion and the fitting portion are eccentrically disposed,
the first hinge is switched between a first state where the fitting portion is inserted into the pin fitting hole in a first posture and a second state where the fitting portion is inserted into the pin fitting hole in a second posture where the hinge pin is turned by a predetermined angle in a circumferential direction from the first posture,
the insertion portion in the second state is shifted in a front-and-rear direction of the opening/closing cover with respect to the insertion portion in the first state,
by manually switching between the first state and the second state according to a level difference between contact end portions of the opening/closing cover in the closing state and the cover attaching body, hinge axes of the first and second hinges are shifted in a front-and-rear direction of the opening/closing cover so that the level difference can be reduced,
the second hinge includes a hinge pin provided in one of the edge of the opening/closing cover and the cover attaching body and a pin insertion hole provided in the other of the edge of the opening/closing cover and the cover attaching body,
one of the hinge pin and the pin insertion hole is provided in a supporting bracket provided in the opening/closing cover,
a spacer is provided so as to be interposed or not to be interposed between the supporting bracket and a supporting bracket attachment face formed in the opening/closing cover,
it is configured to be switched into a spacer interposition state where the spacer is interposed between the supporting bracket and the supporting bracket attachment face and a spacer non-interposition state where the spacer is not interposed between the supporting bracket and the supporting bracket attachment face, the opening/closing cover in the spacer interposition state is shifted in the front-and-rear direction of the opening/closing cover with respect to the opening/closing cover in the spacer non-interposition state, and by manually switching between the spacer interposition state and the spacer non-interposition state according to the level difference, the hinge axes of the first and second hinges are shifted in the front-and-rear direction of the opening/closing cover so that the level difference can be reduced.

2. The opening/closing cover attachment structure according to claim 1, wherein
the predetermined angle is 180 degrees.

3. The opening/closing cover attachment structure according to claim 1, wherein
the fitting portion and the pin fitting hole are formed to have a rectangular cross section long in the front-and-rear direction of the opening/closing cover.

4. The opening/closing cover attachment structure according to claim 1, wherein
the spacer is supported in a turnable manner between the spacer interposition state and the spacer non-interposition state.

5. The opening/closing cover attachment structure according to claim 1, wherein
the edge of the opening/closing cover is a side edge of the opening/closing cover, the first hinge and the second hinge are disposed via an interval in an upper-and-lower direction, and the holding part is disposed on a lateral side between the first hinge and the second hinge.

6. The opening/closing cover attachment structure according to claim 5, wherein
the first hinge is provided between an upper portion of the side edge of the opening/closing cover and the cover attaching body, the second hinge is provided between a middle portion in the upper-and-lower direction of the side edge of the opening/closing body and the cover attaching body, and a lower end portion of the opening/closing cover is in a free state where it is not fixed to the cover attaching body.

7. The opening/closing cover attachment structure according to claim 1, wherein
the holding part includes a magnet and a magnet attaching part which are distributed in the opening/closing cover and the cover attaching body.

* * * * *